United States Patent
Ackermann et al.

(10) Patent No.: US 12,534,823 B2
(45) Date of Patent: Jan. 27, 2026

(54) APPARATUS AND METHODS FOR REDUCING SUBSTRATE COOL DOWN TIME

(71) Applicant: Applied Materials, Inc., Santa Clara, CA (US)

(72) Inventors: Thomas Ackermann, Feichten (DE); Christian Höpfner, Dresden (DE)

(73) Assignee: Applied Materials, Inc., Santa Clara, CA (US)

( * ) Notice: Subject to any disclaimer, the term of this patent is extended or adjusted under 35 U.S.C. 154(b) by 711 days.

(21) Appl. No.: 17/870,009

(22) Filed: Jul. 21, 2022

(65) Prior Publication Data

US 2023/0160101 A1    May 25, 2023

Related U.S. Application Data

(60) Provisional application No. 63/281,301, filed on Nov. 19, 2021.

(51) Int. Cl.
*C30B 25/16* (2006.01)
*C23C 16/46* (2006.01)
(Continued)

(52) U.S. Cl.
CPC ............ *C30B 25/16* (2013.01); *C23C 16/463* (2013.01); *C23C 16/52* (2013.01); *H01L 21/67742* (2013.01); *H01L 21/68707* (2013.01)

(58) Field of Classification Search
CPC ....... C23C 16/463; C23C 16/52; C30B 16/52; C30B 25/08; C30B 25/16; C30B 35/005;
(Continued)

(56) References Cited

U.S. PATENT DOCUMENTS 6,074,443 A * 6/2000 Venkatesh ......... H01L 21/67276
                                                          29/25.01
6,162,010 A    12/2000 Ishizawa et al.
(Continued)

FOREIGN PATENT DOCUMENTS

EP      0706209 A2    4/1996
JP    2000-164532 A    6/2000
(Continued)

OTHER PUBLICATIONS

International Search Report and Written Opinion for International Application No. PCT/US2022/037784 dated Nov. 10, 2022, 9 pages.
(Continued)

*Primary Examiner* — Kidest Worku
(74) *Attorney, Agent, or Firm* — Patterson + Sheridan, LLP

(57) ABSTRACT

A method and apparatus for reducing cool-down times within a cool-down chamber are described herein. The method and apparatus include a process chamber, a transfer chamber, a dual-handled transfer robot within the transfer chamber, and a cool-down chamber. The dual-handled transfer robot it utilized to transfer a substrate between the process chamber and the cool-down chamber. The amount of time the substrate is disposed on the dual-handled transfer robot before being moved into the cool-down chamber is multiplied by a correction factor and subtracted from an original cool down time to achieve an adjusted cool down time. The adjusted cool down time is determined separately for each substrate being cooled within the cool-down chamber.

20 Claims, 6 Drawing Sheets

(51) Int. Cl.
  *C23C 16/52* (2006.01)
  *H01L 21/677* (2006.01)
  *H01L 21/687* (2006.01)

(58) Field of Classification Search
  CPC ......... H01L 21/67109; H01L 21/67167; H01L 21/6719; H01L 21/67196; H01L 21/67201; H01L 21/67248; H01L 21/67276; H01L 21/67742; H01L 21/67745; H01L 21/68707; H01L 21/00; H01L 22/00; H01L 2221/00
  See application file for complete search history.

(56) References Cited

U.S. PATENT DOCUMENTS

| 6,193,811 | B1* | 2/2001 | Sundarrajan | C23C 14/564 |
| | | | | 134/21 |
| 6,209,220 | B1* | 4/2001 | Raaijmakers | C23C 16/56 |
| | | | | 34/433 |
| 9,805,962 | B2 | 10/2017 | Ito et al. | |
| 2007/0006936 | A1* | 1/2007 | Hosokawa | H01L 21/67201 |
| | | | | 141/8 |
| 2008/0216077 | A1 | 9/2008 | Emani et al. | |
| 2012/0004753 | A1* | 1/2012 | Ogi | H01L 21/67253 |
| | | | | 700/100 |
| 2015/0139758 | A1 | 5/2015 | Ito et al. | |
| 2016/0307783 | A1* | 10/2016 | Iida | H01L 21/67167 |
| 2018/0226306 | A1* | 8/2018 | Suzuki | C23C 16/46 |

FOREIGN PATENT DOCUMENTS

| KR | 10-2015-0023254 A | 3/2015 |
| TW | 201936472 A | 9/2019 |
| WO | 2021/131276 A1 | 7/2021 |

OTHER PUBLICATIONS

Office Action for Korean Application No. 10-2024-7002634 dated Feb. 6, 2025.
Office Action for Taiwan Application No. 111127361 dated Apr. 26, 2023.
Search Report for Taiwan Application No. 111127361 dated Apr. 26, 2023.

* cited by examiner

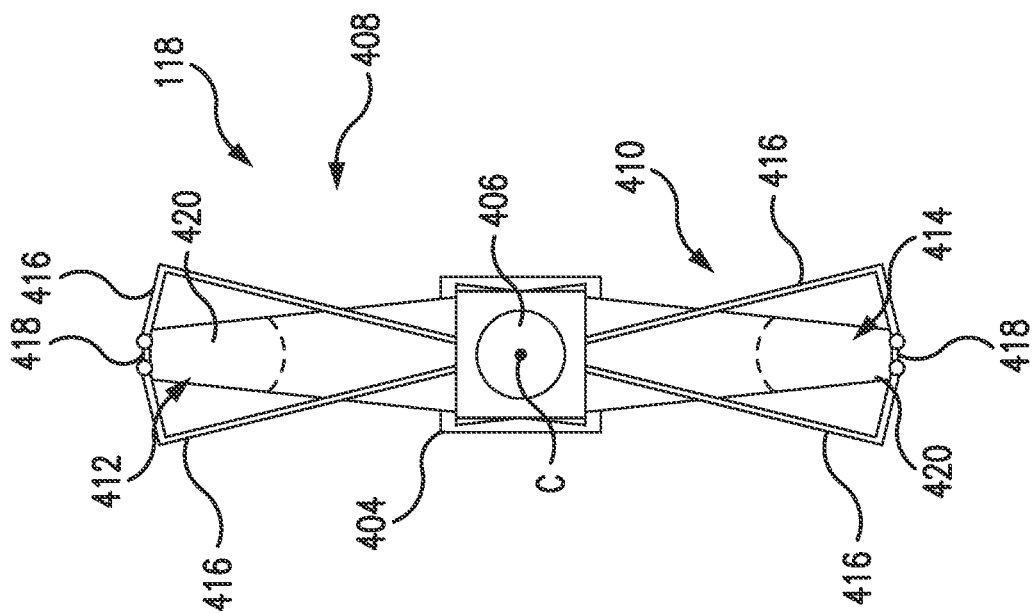
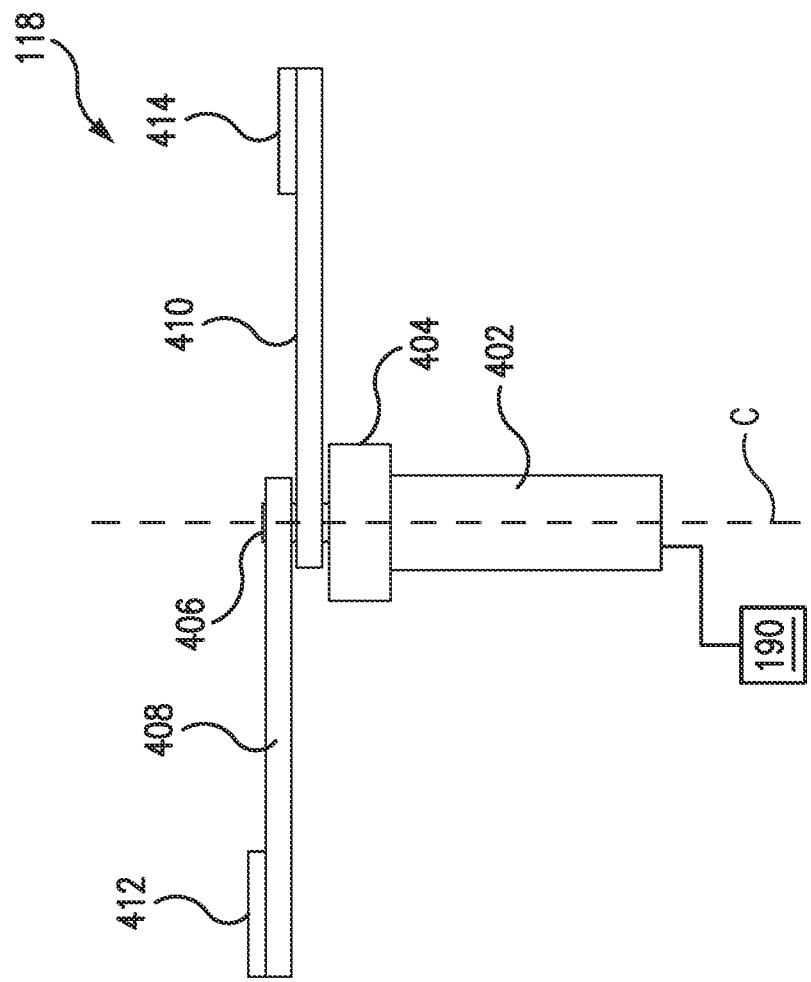
FIG. 4A
FIG. 4B

APPARATUS AND METHODS FOR REDUCING SUBSTRATE COOL DOWN TIME

CROSS-REFERENCE TO RELATED APPLICATIONS

This application claims priority to U.S. Provisional Patent Application No. 63/281,301, filed Nov. 19, 2021, the entirety of which is herein incorporated by reference.

BACKGROUND

Field

Embodiments of the present disclosure generally relate to apparatus and methods for processing a substrate. More specifically, the disclosure is directed towards apparatus and methods for improving throughput of a substrate during semiconductor manufacturing processes.

Description of the Related Art

Many applications in semiconductor manufacturing utilize the deposition of one or more epitaxy layers. Epitaxial deposition is a relatively slow process which challenges throughput.

As technology evolves, the power device process landscape for epitaxial deposition applications is changing. Current trends favor thinner epitaxial layers and running a substrate through multiple deposition operations between each substrate cleaning operation.

Reduced epitaxial layer thickness has been shown to shift the limiting time factor from the epitaxial deposition operation itself to the substrate loading and unloading operations. In some instances, one or more process chambers are left unused for prolonged periods of time due to delays in loading/unloading substrates.

Therefore, what is needed are improved loading/unloading mechanisms and methods for improving throughput.

SUMMARY

In one embodiment, a method of processing a substrate, suitable for use in semiconductor manufacturing, is described. The method includes removing a first substrate from a processing chamber using a transfer robot with two or more arms, moving the first substrate into a transfer chamber, moving the first substrate into a cool-down chamber, determining a wait time of the first substrate within the transfer chamber, determining a cool down factor dependent on the wait time, and determining an adjusted cool down time using the cool down factor and a determined original cool down time.

In another embodiment, a method of processing a substrate, suitable for use in semiconductor manufacturing, is described. The method includes process operations of (a) removing a first substrate from a processing chamber using a first arm of a transfer robot, (b) moving the first substrate into a transfer chamber, (c) moving a second substrate on a second arm of the transfer robot into the processing chamber, (d) moving the first substrate into a cool-down chamber, (e) determining a wait time of the first substrate on the first arm within the transfer chamber, (f) determining a cool down factor dependent on the wait time, and (g) determining an adjusted cool down time using the cool down factor and a determined original cool down time.

In another embodiment, a processing system, suitable for use during semiconductor processing, is described. The processing system includes a transfer chamber comprising a transfer robot having a first arm and a second arm, a plurality of processing chambers coupled to the transfer chamber, one or more cool-down chambers, and a controller storing instructions. The stored instructions within the controller enable process operations of: removing a first substrate from one of the plurality of processing chambers using a first arm of the transfer robot, moving the first substrate into the transfer chamber, moving the first substrate into the cool-down chamber, determining a wait time of the first substrate within the transfer chamber, determining a cool down factor dependent on the wait time, and determining an adjusted cool down time using the cool down factor and a determined original cool down time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 4A-4B are schematic views of a transfer robot, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
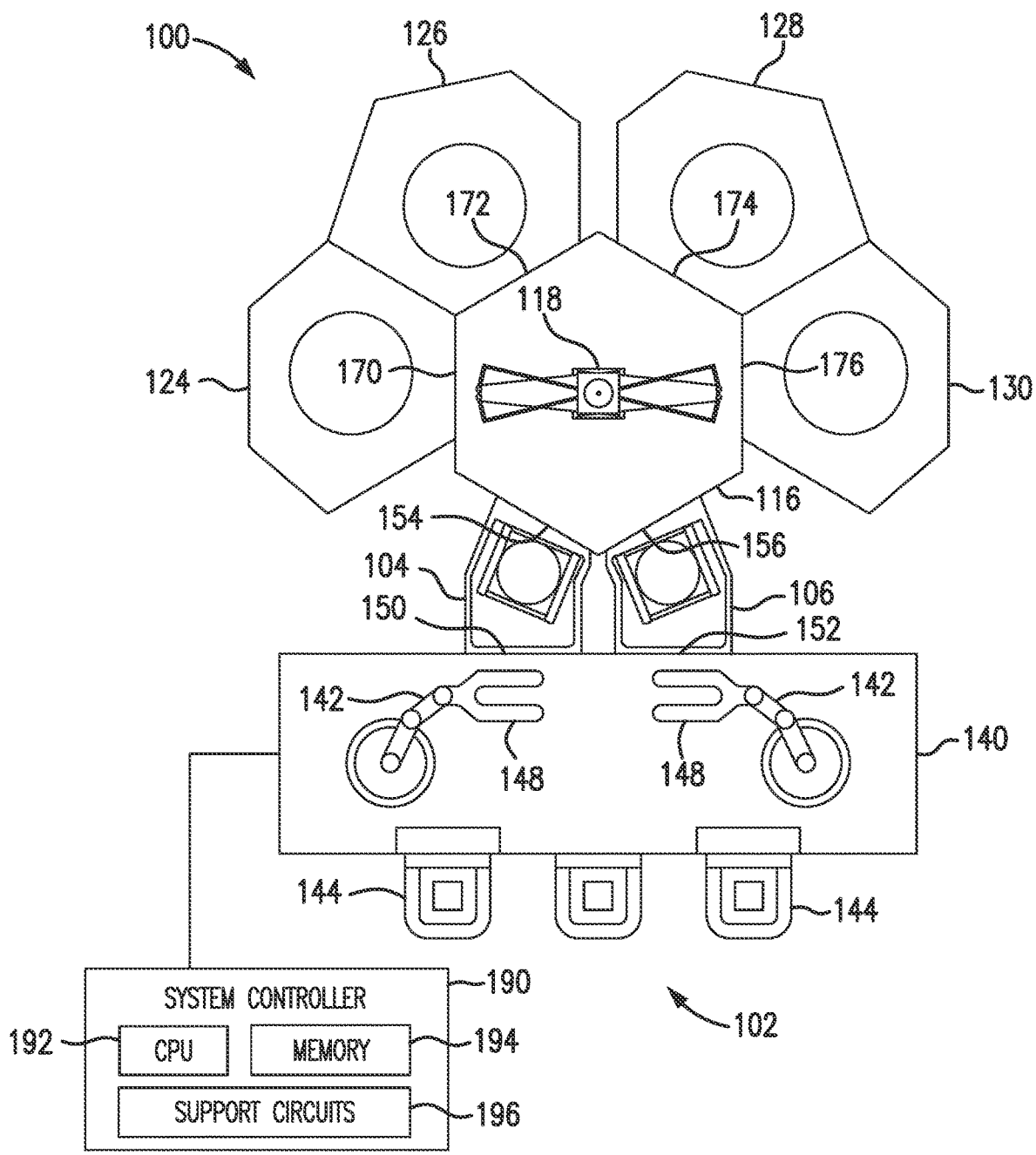
FIG. 1 is a schematic plan view of a processing system, according to one or more embodiments.

The present disclosure is directed towards apparatus and methods for reducing backlog of substrates within a processing system. More specifically, the present disclosure is directed towards apparatus and methods for reducing substrate cool-down times within a cool-down chamber. As the amount of time the substrate is being processed within a process chamber has decreased, the amount of time to load and unload a substrate from the process chamber has become a limiting factor. The implementation of a transfer robot with two or more substrate handlers reduces the amount of loading and unloading time. As the loading and unloading time has decreased, the time a substrate is cooled within a cool down chamber has become a limiting factor in overall substrate throughput within the processing system.

In embodiments wherein the transfer robot is configured to hold two substrates, a first substrate is unloaded from a process chamber using a first handler arm, while a second substrate is held by a second handler arm. The first substrate is hot while being removed from the process chamber. Once the first substrate is unloaded from the process chamber, the second substrate is inserted into the process chamber. While the second substrate is being inserted into the process chamber, the first substrate is idle on the first arm. Once the second substrate has been loaded into the process chamber, the first substrate is then inserted into a cool-down chamber. The cool-down chamber performs a cooling process on the first substrate while the second substrate is processed within the process chamber. In some embodiments, the amount of time the second substrate is within the processing chamber is less than the amount of time the first substrate is within the cool-down chamber. Additional substrates are also processed in additional process chambers attached to the processing system. The cool-down chamber also serves as an exit path from the processing system. Therefore, as additional substrates are processed in each of the process chambers, the wait time for the substrates to be inserted into and cooled by the cool-down chamber causes a backlog within the processing system.

As discussed herein, cool down time within a processing system is regulated, such that each substrate is disposed within the cool-down chamber for a pre-determined time. The pre-determined time may be a minimum time which increases based off of temperature measurements within the cool-down chamber. The pre-determined time enables cooling of the substrate to below a pre-determined temperature before being unloaded from the cool-down chamber. The cool-down time may be a pre-set value time of about 60 seconds to about 80 seconds, such as about 65 seconds to about 75 seconds. Embodiments described herein provide methods for reducing the pre-determined time on an individualized substrate basis and improving the overall throughput of the processing system.

The cool-down time of substrates passing through the cool-down chamber may be reduced by accounting for the wait time of each substrate on the handler arm of the transfer robot. As the first substrate is held by the handler arm after being removed from the process chamber, the first substrate is cooled within the transfer chamber. The hot substrate dissipates heat into the transfer chamber volume, such that the temperature of the substrate is reduced while positioned in the transfer chamber.

The cooling of the substrate is a byproduct of the temperature and gas flow conditions within the transfer chamber volume of the transfer chamber. In some embodiments, the transfer chamber includes a constant nitrogen purge, such that the transfer chamber volume is filled with the nitrogen purge gas and the temperature of the nitrogen purge gas within the transfer chamber volume and surrounding the substrate is relatively constant. The amount of time the first substrate is held by the handler arm before being transferred into the cool-down chamber varies for each substrate processed within the processing system. The variability of the wait times on the handler arm varies depending on the processing sequences within other portions of the processing system. By tracking the amount of time each substrate waits on a handler arm of the transfer robot within the transfer chamber, the cool-down time for each substrate may be individually adjusted and reduced.

A controller within the processing system is configured to determine the wait time within the transfer chamber of each of the hot substrates after the substrates are extracted from the processing chamber. The wait times may also be estimated from historical processing data or process simulations. The wait time is utilized to reduce the overall cool-down time within each cool-down chamber. As described herein, the wait time determined by the controller is multiplied by a cooling variable, such as a safety factor, to determine a cool-down factor. The cooling variable may be about 0.5 to about 1.0, such as about 0.6 to about 0.8, such as about 0.6 to about 0.7. The cool-down factor is an estimated reduction in cool-down time. The cool-down factor is subtracted from the overall cool-down time within the cool-down chamber to form an adjusted cool-down process. The overall cool-down time may be the pre-determined cool down time. The adjusted cool-down process has a generally lower cool-down time per substrate compared to the overall cool-down time if the cool-down factor was not compensated for. The adjusted cool-down process has been shown to increase overall throughput of the processing system. In some embodiments, the throughput improvement caused by accounting for cooling within the transfer chamber improves the throughput of the processing system by up to 10%. Utilization of the methods described herein may therefore increase overall throughput while not increasing processing costs.

FIG. 1 is a schematic plan view diagram of an example of a semiconductor processing system 100 according to one or more embodiments. The processing system 100 generally includes a factory interface 102, load lock chambers 104, 106, a transfer chamber 116 with a transfer robot 118, and processing chambers 124, 126, 128, 130. As detailed herein, substrates in the processing system 100 can be processed in and transferred between the various chambers without being exposed to an ambient environment exterior to the processing system 100. For example, substrates can be processed in and transferred between the various chambers in a low pressure (e.g., less than or equal to about 300 Torr) or vacuum environment without breaking the low pressure or vacuum environment between various processes performed on the substrates in the processing system 100. Accordingly, the processing system 100 may provide for an integrated solution for some processing of substrates.

Examples of a processing system that may be suitably modified in accordance with the disclosure provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 disposed within the docking station 140 to facilitate transfer of substrates. The docking station 140 is coupled to one or more front opening unified pods (FOUPs) 144. In some examples, each factory interface robot 142 generally comprises a blade 148 disposed on one end of the respective factory interface robot 142 configured to transfer substrates from the factory interface 102 to the load lock chambers 104, 106.

The load lock chambers 104, 106 have respective ports 150, 152 coupled to the factory interface 102 and respective ports 154, 156 coupled to the transfer chamber 116. The transfer chamber 116 has respective ports 170, 172, 174, 176 coupled to processing chambers 124, 126, 128, 130. The ports 154, 156, 170, 172, 174, 176 can be, for example, slit openings with slit valves for passing substrates therethrough by the transfer robot 118 and for providing a seal between respective chambers to prevent a gas from passing between the respective chambers. Generally, any port is open for transferring a substrate therethrough; otherwise, the port is closed. The transfer robot 118 may be a dual-handler robot, such that the transfer robot 118 is configured to handle two substrates simultaneously.

The load lock chambers 104, 106, the transfer chamber 116, and the processing chambers 124, 126, 128, 130 may be fluidly coupled to a gas and pressure control system. The gas and pressure control system can include one or more gas pumps (e.g., turbo pumps, cryo-pumps, roughing pumps, etc.), gas sources, various valves, and conduits fluidly coupled to the various chambers. In operation, a factory interface robot 142 transfers a substrate from a FOUP 144 through a port 150 or 152 to a load lock chamber 104 or 106. The gas and pressure control system then pumps down the load lock chamber 104 or 106. The gas and pressure control system further maintains the transfer chamber 116 with an interior low pressure or vacuum environment (which may include an inert gas). Hence, the pumping down of the load lock chamber 104 or 106 facilitates passing the substrate between e.g., the atmospheric environment of the factory interface 102 and the low pressure or vacuum environment of the transfer chamber 116.

One or both of the load lock chambers 104, 106 are configured to cool a substrate. The load lock chambers 104, 106 may therefore be referred to as cool-down chambers or cooling chambers. The load lock chambers 104, 106 are configured to have a substrate pass therethrough. In examples described herein, a substrate may be inserted into the load lock chamber 104 after being processed within one of the processing chambers 124, 126, 128, 130. The substrate is cooled within the load lock chamber 104 before being moved into the docking station 140.

The processing chambers 124, 126, 128, 130 can be any appropriate chamber for processing a substrate. In some examples, additional transfer chambers and processing chambers are included within the processing system, such that at least one processing chamber is capable of performing a cleaning process and another processing chamber can be capable of performing an etch process. Each of the processing chambers 124, 126, 128, 130 can be capable of performing a deposition process, such as an epitaxial growth processes. The cleaning chamber may be a SiCoNi™ Preclean chamber available from Applied Materials of Santa Clara, Calif. The etching chamber may be a Selectra™ Etch chamber available from Applied Materials of Santa Clara, Calif. Other chambers, including those from other manufacturers, are also contemplated. In some embodiments, one of the processing chambers 124, 126, 128, 130 is a cooling chamber or cool-down chamber separate from the load lock chambers 104, 106.

A system controller 190 is coupled to the processing system 100 for controlling the processing system 100 or components thereof. For example, the system controller 190 may control the operation of the processing system 100 using a direct control of the chambers 104, 106, 116, 124, 126, 128, 130 of the processing system 100 or by controlling controllers associated with the chambers 104, 106, 116, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general purpose processor that can be used in an industrial setting. The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular processing chamber) as, e.g., a software routine. When the computer instruction code is executed by the CPU 192, the CPU 192 controls the chambers to perform processes in accordance with the various methods. Other processing systems can be in other configurations. For example, more or fewer processing chambers may be coupled to a transfer apparatus.

Figure 2:
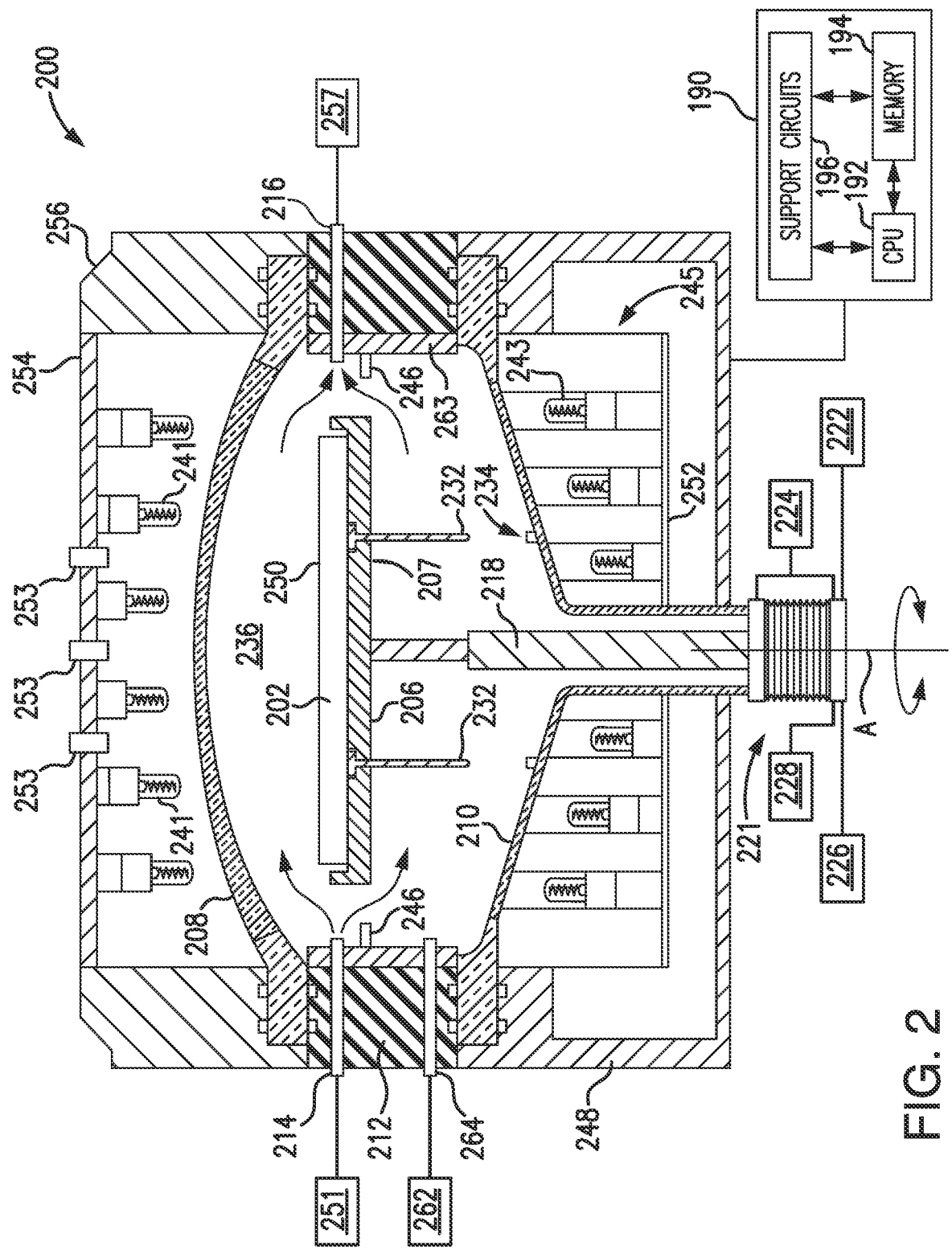
FIG. 2 is a schematic cross-sectional view of a processing chamber that may be used to perform deposition processes, according to one or more embodiments.

FIG. 2 is a schematic cross-sectional view of a process chamber 200 that may be used to perform deposition processes. The process chamber 200 may be used as any one of the processing chambers 124, 126, 128, 130. The process chamber 200 is utilized to grow an epitaxial film on a substrate, such as the substrate 202. The process chamber 200 creates a cross-flow of precursors across the top surface 250 of the substrate 202.

The process chamber 200 includes an upper body 256, a lower body 248 disposed below the upper body 256, a flow module 212 disposed between the upper body 256 and the lower body 248. The upper body 256, the flow module 212, and the lower body 248 form a chamber body. Disposed within the chamber body is a substrate support 206, an upper dome 208, a lower dome 210, a plurality of upper lamps 241, and a plurality of lower lamps 243. As shown, the controller 190 is in communication with the process chamber 200 and is used to control processes, such as those described herein. The substrate support 206 is disposed between the upper dome 208 and the lower dome 210. The plurality of upper lamps 241 are disposed between the upper dome 208 and a lid 254. The lid 254 includes a plurality of sensors 253 disposed therein for measuring the temperature within the process chamber 200. The plurality of lower lamps 243 are disposed between the lower dome 210 and a floor 252. The plurality of lower lamps 243 form a lower lamp assembly 245.

A processing volume 236 is formed between the upper dome 208 and the lower dome 210. The processing volume 236 has the substrate support 206 disposed therein. The substrate support 206 includes a top surface on which the substrate 202 is disposed. The substrate support 206 is attached to a shaft 218. The shaft 218 is connected to a motion assembly 221. The motion assembly 221 includes one or more actuators and/or adjustment devices that provide movement and/or adjustment of the shaft 218 and/or the substrate support 206 within the processing volume 236. The motion assembly 221 includes a rotary actuator 222 that rotates the shaft 218 and/or the substrate support 206 about a longitudinal axis A of the process chamber 200. The motion assembly 221 further includes a vertical actuator 224 to lift and lower the substrate support 206 in the z-direction. The motion assembly includes a tilt adjustment device 226 that is used to adjust the planar orientation of the substrate support 206 and a lateral adjustment device 228 that is used to adjust the position of the shaft 218 and the substrate support 206 side to side within the processing volume 236.

The substrate support 206 may include lift pin holes 207 disposed therein. The lift pin holes 207 are sized to accommodate a lift pin 232 for lifting of the substrate 202 from the substrate support 206 either before or after a deposition process is performed. The lift pins 232 may rest on lift pin stops 234 when the substrate support 206 is lowered from a processing position to a transfer position.

The flow module 212 includes a plurality of process gas inlets 214, a plurality of purge gas inlets 264, and one or more exhaust gas outlets 216. The plurality of process gas inlets 214 and the plurality of purge gas inlets 264 are disposed on the opposite side of the flow module 212 from the one or more exhaust gas outlets 216. One or more flow guides 246 are disposed below the plurality of process gas inlets 214 and the one or more exhaust gas outlets 216. The flow guide 246 is disposed above the purge gas inlets 264. A liner 263 is disposed on the inner surface of the flow module 212 and protects the flow module 212 from reactive gases used during deposition processes. The process gas inlets 214 and the purge gas inlets 264 are positioned to flow a gas parallel to the top surface 250 of a substrate 202 disposed within the processing volume 236. The process gas inlets 214 are fluidly connected to a process gas source 251. The purge gas inlets 264 are fluidly connected to a purge gas source 262. The one or more exhaust gas outlets 216 are fluidly connected to an exhaust pump 257. Each of the process gas source 251 and the purge gas source 262 may be configured to supply one or more precursors or process gases into the processing volume 236.

Figure 3:
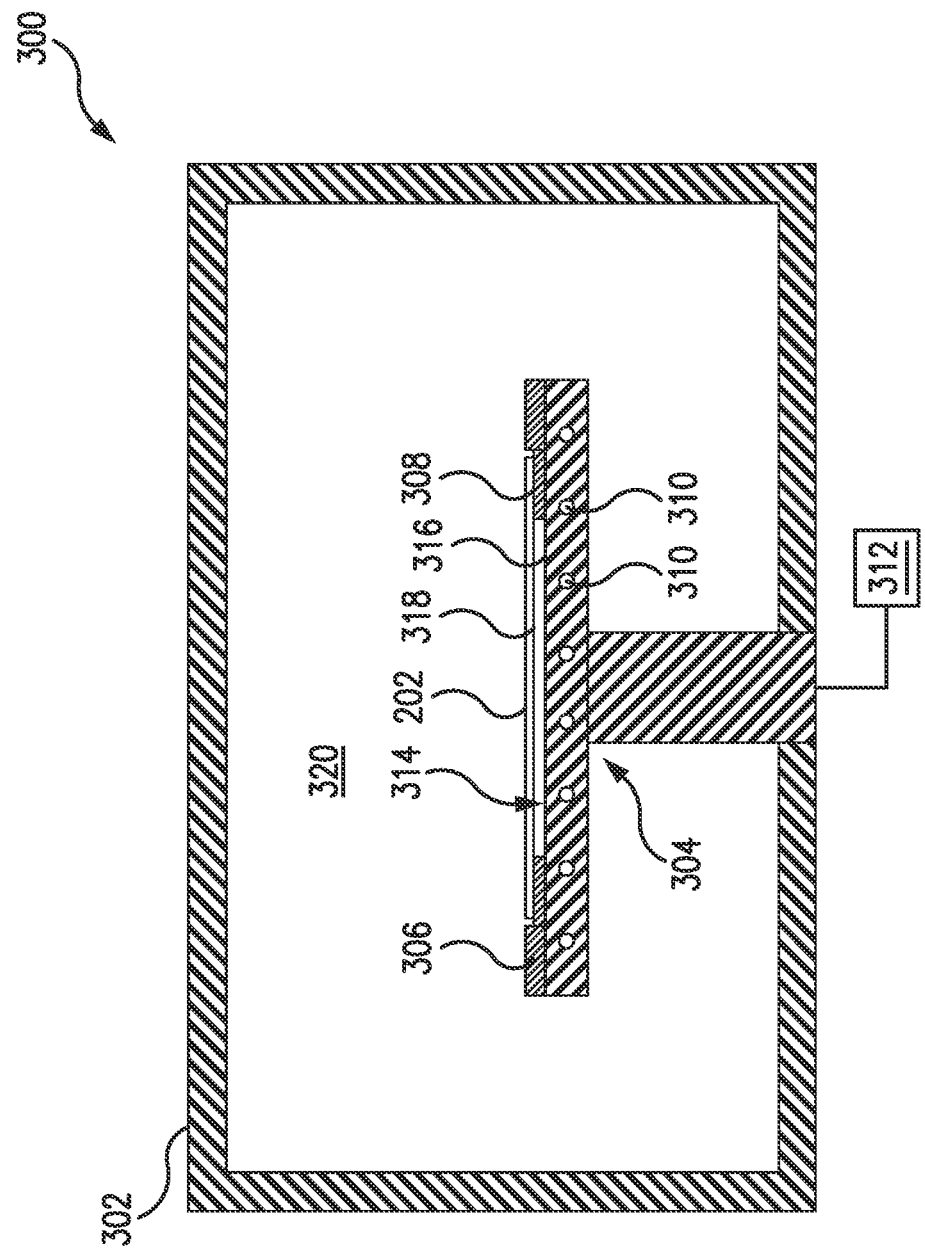
FIG. 3 is a schematic cross-sectional view of a cool-down chamber, according to one or more embodiments.

FIG. 3 is a schematic cross-sectional view of a cool-down chamber 300. The cool-down chamber 300 may be utilized as either or both of the load lock chambers 104, 106. In some embodiments, the cool-down chamber 300 may be one of the processing chambers 124, 126, 128, 130. The cool-down chamber 300 is configured to cool a substrate, such as the substrate 202. The substrate 202 is positioned on a cooling pedestal 304. The cooling pedestal 304 is configured to cool the substrate 202. The cooling pedestal 304 is disposed within a chamber body 302. The chamber body 302 forms a process volume 320. The process volume 320 is maintained at a vacuum.

The cooling pedestal 304 is disposed within the process volume 320. The cooling pedestal 304 includes a support plate 306. The support plate 306 is a ring-shaped plate and is configured to support an outer edge of the substrate 202. The outer edge of the substrate 202 rests on a support ledge 308 of the support plate 306. The central portion of the support plate 306 is open. A plenum 314 is disposed within the opening and between a bottom surface 318 of the substrate 202 and a top surface 316 of the cooling pedestal 304. The substrate 202 is not disposed directly on the top surface 316 of the cooling pedestal 304 to avoid rapid cooling of the bottom surface 318 of the substrate 202 relative to the top surface 250. The separation of the substrate 202 from the cooling pedestal 304 further reduces contamination of the substrate 202 from the material of the cooling pedestal 304. The cooling pedestal 304 is formed of a thermally conductive material, such as a metal or a metal alloy.

One or more cooling elements 310 are disposed through the cooling pedestal 304. The cooling elements 310 assist in regulating the temperature of the cooling pedestal 304. In some embodiments, the cooling elements 310 include one or more cooling channels. The one or more cooling channels may include a cooled liquid flowing therethrough, such as chilled water. The cooling liquid is provided from a coolant source 312. The process volume 320 is also maintained at a relatively cool temperature. The temperatures of one or both of the cooling pedestal 304 and the process volume 320 are below about 200° C., such as below about 100° C., such as below about 75° C.

FIGS. 4A-4B are schematic views of the transfer robot 118. As shown in FIG. 4A, the transfer robot 118 is disposed within the transfer chamber 116. The transfer robot 118 includes a first arm 408 and a second arm 410. The first arm 408 includes a first handler 412. The second arm 410 includes a second handler 414. Each of the first handler 412 and the second handler 414 are configured to hold a substrate, such as the substrate 202.

The first arm 408 and the second arm 410 are attached to a robot actuation shaft 406. The robot actuation shaft 406 is centered about an axis C. The axis C is the axis about which the first arm 408 and the second arm 410 are moved. The robot actuation shaft 406 is coupled to an actuator 404 either mechanically or magnetically. In some embodiments, the coupling of the first arm 408, second arm 410, and the robot actuation shaft 406 to the actuator 404 is through magnets, such that the actuator 404 is disposed outside of the vacuum environment of the transfer chamber 116 and leak tightness is improved. The actuator 404 is configures to rotated the robot actuation shaft 406 and move the first arm 408 and the second arm 410.

The actuator 404 is disposed on top of and mechanically coupled to a robot support shaft 402. The robot support shaft 402 is configured to support the transfer robot 118.

As shown in FIG. 4B, each of the first arm 408 and the second arm 410 are disposed opposite one another, such that the first arm 408 and the second arm 410 are disposed on opposite sides of the robot actuation shaft 406. Each of the first arm 408 and the second arm 410 may be either independently operated or dependently operated. Independent operation includes moving one of the first arm 408 or the second arm 410 without the other of the first arm 408 or the second arm 410 being moved simultaneously. Dependent operation includes both of the first arm 408 and the second arm 410 moving simultaneously, such that both the first arm 408 and the second arm 410 are actuated the same amount at the same time around the axis C.

Each of the first arm 408 and the second arm 410 include a substrate support surface 420, a substrate stop 418, and two or more gripping arms 416. The two or more gripping arms 416 are configured to contact wither side of a substrate and hold the substrate in place on the substrate support surface 420. The substrate stop 418 is disposed at the distal end of the first arm 408 and the second arm 410 furthest from the robot actuation shaft 406. The substrate stop 418 is a lip or ledge extending upward from the substrate support surface 420 and configured to support an outward portion of a substrate disposed on the substrate support surface 420. The substrate stop 418 prevents the substrate from falling off of the substrate support surface 420 while the first arm 408 and the second arm 410 rotate around the axis C.

Figure 5:
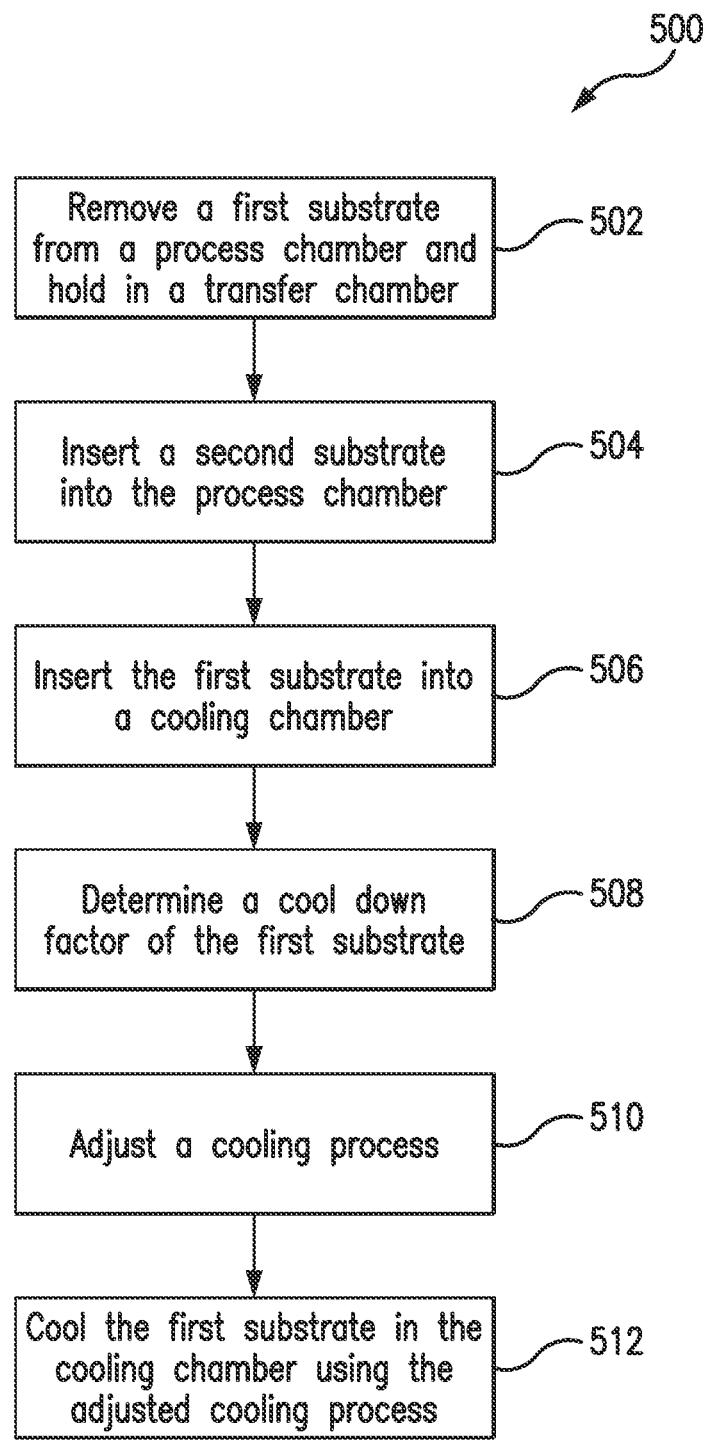
FIG. 5 illustrates a method of cooling a substrate, according to one or more embodiments.

FIG. 5 illustrates a method 500 of cooling a substrate, such as the substrate 202. The method 500 is performed after a first substrate has been processed within a process chamber, such as the processing chambers 124, 126, 128, 130 of FIG. 1. The processing chambers 124, 126, 128, 130 may be deposition chambers, such as the process chamber 200 of FIG. 2. Once the first substrate has been processed in one or more of the processing chambers the first substrate is removed from the processing chamber by a transfer robot, such as the transfer robot 118, and held in a transfer chamber, such as the transfer chamber 116, during an operation 502. The first substrate is removed from the processing chamber by a first arm of the transfer robot. The first substrate may sometimes be referred to as a hot substrate as the first substrate is at a temperature of greater than about 250° C., such as greater than about 300° C., such as greater than about 350° C., such as greater than about 400° C., such as greater than about 450° C. when first removed from one of the processing chambers after a deposition operation.

While the first substrate is being removed from the processing chamber, a second substrate is disposed on the second arm of the transfer robot, such that the second substrate is held by the transfer robot simultaneously with the first substrate. The second substrate is previously located in any of the other processing chambers or may have been in another load lock chamber, such as one of the load lock chambers 104, 106.

Throughout the method 500, the transfer chamber 116 is held at vacuum and is constantly purged using a purge gas. The purge gas may be an inert gas. The purge gas may be one or a combination of helium (He), neon (Ne), argon (Ar), krypton (Kr), or nitrogen ($N_2$) gas. The transfer chamber 116 is held at a temperature of less than about 50° C., such as less than about 45° C., such as less than about 40° C. In some embodiments the temperature is about 20° C. to about 50° C., such as about 25° C. to about 45° C.

Once the first substrate has been removed from the processing chamber and is positioned within the transfer chamber on the first arm, the second substrate is inserted into the processing chamber using the second arm of the transfer robot. Positioning the second substrate in the processing chamber is performed during an operation 504. While inserting the second substrate into the processing chamber during operation 504, the first substrate is held on the first arm of the transfer robot. While the first substrate is held on the first arm within the transfer chamber, the first substrate is passively cooled. Passive cooling of the first substrate is caused by heat loss within the cool inner volume of the transfer chamber 116.

After the second substrate has been inserted into the processing chamber, the first substrate remains on the first arm of the transfer robot until a cool-down chamber is available. Once a cool-down chamber is available, the first substrate is inserted into the cool-down chamber during another operation 506. Inserting the first substrate into the cool-down chamber includes using the first arm to move the substrate and place the first substrate onto a substrate support within the cool-down chamber. The cool-down chamber may be one of the load lock chambers 104, 106. The cool-down chamber is configured to have a similar architecture to the cool-down chamber 300 of FIG. 3.

Either after or simultaneously to the placement of the first substrate into the cool-down chamber, a cool down factor of the first substrate is determined during an operation 508. The cool down factor is an offset value for the total cool down time of the first substrate. To determine the cool down factor, a time the first substrate is held on the first arm of the transfer robot and within the transfer chamber is recorded by the controller 190. The time the first substrate is held on the first arm includes all of the time during operation 502, operation 504, and operation 506 in which the first substrate is disposed on the first arm. The amount of time the first substrate is held on the first arm within the transfer chamber is multiplied by a cooling variable. The cooling variable may also be described as a safety factor. The cooling variable is a multiplier for the total idle time of the substrate within the transfer chamber. The multiple of the cooling variable and the idle time is the cool down factor. The cool down factor is a unit of time. The cool down factor is determined during another operation 508 either after the first substrate is moved into the cool-down chamber or simultaneously with moving the first substrate into the cool-down chamber. The cool down factor is utilized to represent an amount of time which may be subtracted from the time the first substrate spends in the cool-down chamber. The cooling variable may be a factor of less than or equal to 1, such as about 0.5 to about 1.0, such as about 0.6 to about 0.9, such as about 0.6 to about 0.7, such as about 0.7. The cooling variable is generally less than 1 as the rate of cooling of the first substrate within the transfer chamber is less than the rate of cooling of the first substrate within the cool-down chamber.

After determining the cool down factor during the operation 508, the cooling process of the first substrate is adjusted during an operation 510. Adjusting the cooling process during the operation 510 includes changing at least one cooling parameter, such as the time the first substrate is to be cooled within the cool-down chamber. The first substrate is originally configured to be cooled for a first amount of time before the cool down factor is taken into consideration. The first amount of time is pre-determined and similar for each substrate run through the cool-down chamber. Accounting for the cool down factor enables each substrate to be cooled for an adjusted cooling time during the adjusted cooling process. The adjusted cooling time for each substrate is independent and may vary between the individual substrates as each individual substrate is run through the cool-down chamber. Adjusting the cooling process includes subtracting the cool down factor from the original cool down time. In this embodiment, the adjusted cool down time is the original cool down time minus the cool down factor. The cool down factor is the wait time on the transfer robot within the transfer chamber multiplied by the cooling variable.

Once the original cooling time has been adjusted during the operation 510, the first substrate is cooled in the cool-down chamber during an operation 512. The cooling of the first substrate during the operation 512 is performed for the adjusted cool down time. The adjusted cool down time is less than or equal to the original cool down time. The first substrate is cooled to a reduced temperature during the operation 512. The reduced temperature is less than about 50° C., such as less than about 45° C., such as less than about 40° C. In some embodiments the reduced temperature is about 20° C. to about 50° C., such as about 25° C. to about 45° C. The temperature of the first substrate is reduced before being moved to another process chamber or out into a docking station, such as the docking station 140.

Figure 6:
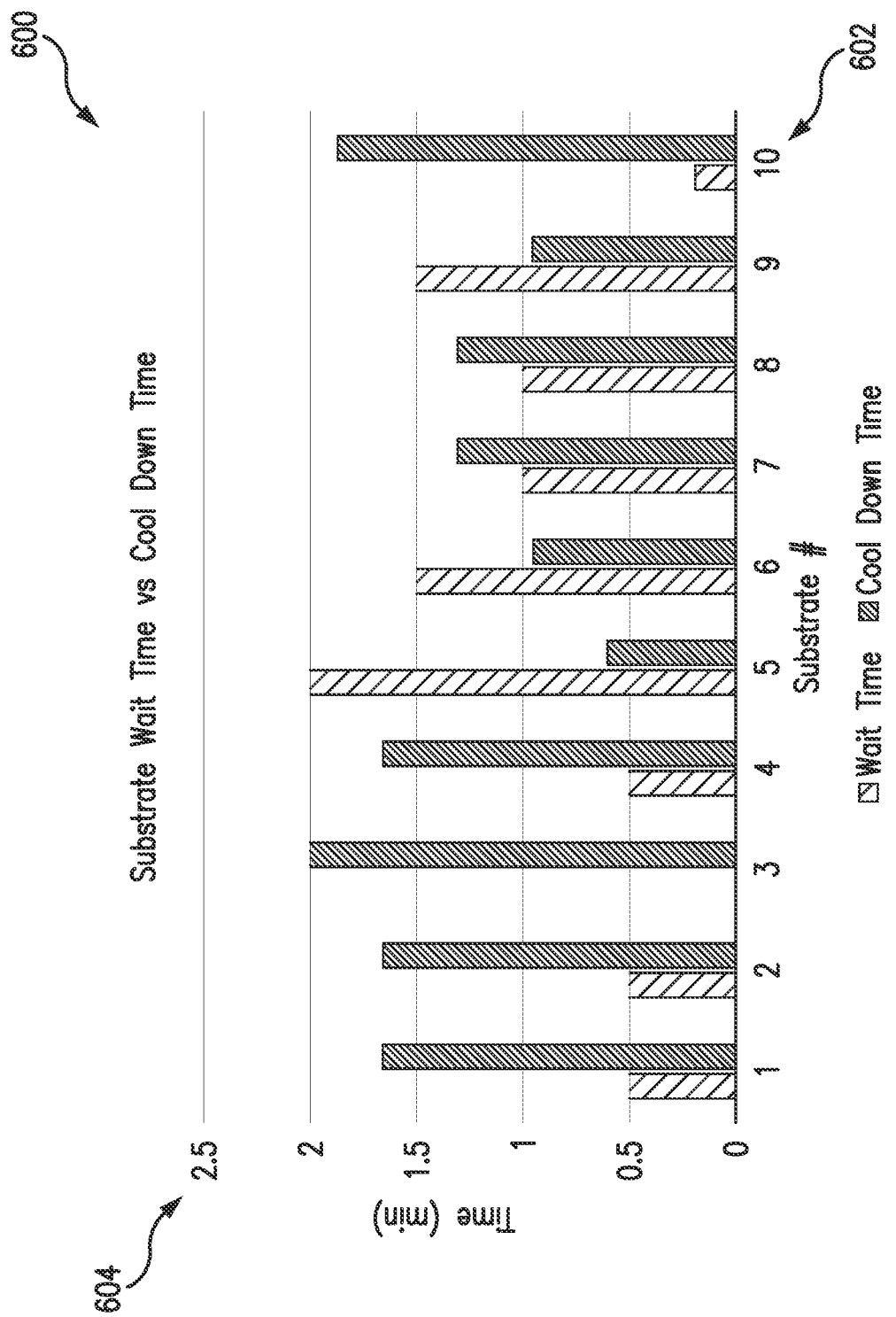
FIG. 6 illustrates a graph of substrate cool-down times as related to wait times, according to one or more embodiments.

FIG. 6 illustrates an exemplary graph 600 of substrate cool-down times as related to wait times within the transfer chamber. The graph 600 includes an independent axis 602, which illustrates the substrate number of each substrate passing through a cool-down chamber and completing the method 500. As shown, data from cooling a set of ten substrates are considered. Each of the ten substrates are run in the order illustrated and immediately after each other. The dependent axis 604 illustrates time in minutes. The time illustrated includes two data sets. A first data set is the wait time the substrate spends on a handler or first arm of a transfer robot and within the transfer chamber. A second data set is the cool down time of the substrate within the cool-down chamber once the time the first substrate spends within the transfer chamber is accounted for using the method 500.

The graph 600 utilizes a cooling variable of 0.7. The cooling variable is multiplied by the total wait time and subtracted from an original cool down time of 2 minutes. The original cool down time may be varied depending upon the beginning temperature of the substrate, the desired end temperature of the substrate, the desired temperature change across the substrate per unit time, and the conditions within the cool-down chamber. As illustrated in the graph 600, a first substrate has a wait time of about 0.5 minutes. The 0.5 minutes is multiplied by the cooling variable of 0.7 and subtracted from the original cool down time of 2 minutes to obtain an adjusted cool down time of 1.65 minutes. A second substrate and a third substrate have a similar wait time and adjusted cool down time as the first substrate. A third substrate has a wait time of about 0 minutes and therefore maintains the total original cool down time of 2 minutes. A fifth substrate has a wait time of 2 minutes. The 2 minutes is multiplied by the cooling variable of 0.7 and subtracted from the original cool down time of 2 minutes to obtain an adjusted cool down time of 0.6 minutes. The sixth substrate, the seventh substrate, the eighth substrate, the ninth substrate, and the tenth substrate also show reduced cool down times using methods described herein.

By reducing the amount of cool down time for some of the substrates, the rate at which substrates are transferred into and out of the cool-down chamber is increased on average. As the cool-down time of the substrates had been found to be a limiting factor, the increased substrate transfer rate through the cool-down chamber increases the overall throughput of substrates through the overall processing system 100.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, suitable for use in semiconductor manufacturing, comprising:
    removing a substrate from a processing chamber using a transfer robot with two or more arms;
    moving the substrate into a transfer chamber;
    moving the substrate into a cool-down chamber;
    determining a wait time of the substrate within the transfer chamber;
    determining a cool down factor based on the wait time;
    determining an adjusted cool down time by adjusting an original cool down time based on the cool down factor; and
    cooling the substrate in the cool-down chamber using the adjusted cool down time.

2. The method of claim 1, wherein the wait time is multiplied by a cooling variable to obtain the cool down factor.

3. The method of claim 2, wherein the cool down factor is subtracted from the original cool down time to obtain the adjusted cool down time.

4. The method of claim 2, wherein the cooling variable is 0.5 to 1.0.

5. The method of claim 1, wherein the wait time is an amount of time the substrate is held by the transfer robot during removing of the substrate from the processing chamber, moving the substrate into the transfer chamber, and moving the substrate into the cool-down chamber.

6. The method of claim 1, wherein the original cool down time is a pre-determined constant value.

7. The method of claim 6, wherein determined the original cool down time is 60 seconds to 80 seconds.

8. A method of processing a substrate, suitable for use in semiconductor manufacturing, comprising:
    (a) removing a first substrate from a processing chamber using a first arm of a transfer robot;
    (b) moving the first substrate into a transfer chamber;
    (c) moving a second substrate on a second arm of the transfer robot into the processing chamber;
    (d) moving the first substrate into a cool-down chamber;
    (e) determining a wait time of the first substrate on the first arm within the transfer chamber;
    (f) determining a cool down factor based on the wait time;
    (g) determining an adjusted cool down time by adjusting an original cool down time based on the cool down factor; and
    (h) cooling the first substrate in the cool-down chamber using the adjusted cool down time.

9. The method of claim 8, wherein (a) is performed before (b), and (b) is performed before (c).

10. The method of claim 8, wherein determining the wait time is performed using historical processing data or process simulations of the wait time within the transfer chamber.

11. The method of claim 8, wherein the wait time is determined by a controller calculating a wait time of the first substrate within the transfer chamber before being positioned into the cool-down chamber.

12. The method of claim 8, wherein the cool down factor is subtracted from the original cool down time to obtain the adjusted cool down time.

13. The method of claim 8, wherein the processing chamber is a deposition chamber.

14. A processing system, suitable for use during semiconductor processing, comprising:
    a transfer chamber comprising a transfer robot having a first arm and a second arm;
    a plurality of processing chambers coupled to the transfer chamber;
    one or more cool-down chambers; and
    a controller storing instructions to enable process operations of:
        removing a substrate from one of the plurality of processing chambers using a first arm of the transfer robot;
        moving the substrate into the transfer chamber;
        moving the substrate into the one or more cool-down chambers;
        determining a wait time of the substrate within the transfer chamber;
        determining a cool down factor based on the wait time;
        determining an adjusted cool down time by adjusting an original cool down time based on the cool down factor; and
        cooling the substrate in the one or more cool-down chambers using the adjusted cool down time.

15. The processing system of claim 14, wherein at least one of the processing chambers is a deposition chamber.

16. The processing system of claim 14, wherein the first arm and the second arm are coupled to an actuator and configured to move simultaneously.

17. The processing system of claim 14, wherein the transfer chamber is separated from each of the plurality of processing chambers and the one or more cool-down chambers by one or more valves.

18. The processing system of claim 14, wherein the transfer chamber is configured to be held at a temperature of less than 50° C.

19. The processing system of claim 14, wherein the wait time is multiplied by a cooling variable of 0.5 to 1.0 to obtain the cool down factor and the cool down factor is subtracted from the original cool down time to obtain the adjusted cool down time.

20. The processing system of claim 14, wherein the substrate comprises a first substrate, and wherein a second substrate is disposed on the second arm of the transfer robot while the first substrate is being removed from the processing chamber.

\* \* \* \* \*